(12) United States Patent
Anderson et al.

(10) Patent No.: US 8,492,819 B2
(45) Date of Patent: Jul. 23, 2013

(54) FET EDRAM TRENCH SELF-ALIGNED TO BURIED STRAP

(75) Inventors: Brent A. Anderson, Jericho, VT (US); John E. Barth, Jr., Williston, VT (US); Edward J. Nowak, Essex Junction, VT (US); Jed H. Rankin, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 192 days.

(21) Appl. No.: 13/182,738

(22) Filed: Jul. 14, 2011

(65) Prior Publication Data

US 2013/0015515 A1 Jan. 17, 2013

(51) Int. Cl.
*H01L 27/06* (2006.01)
*H01L 21/20* (2006.01)

(52) U.S. Cl.
USPC ............ 257/301; 257/E29.346; 257/E21.396; 438/244

(58) Field of Classification Search
USPC ............ 257/301, E29.346, E21.396; 438/244
See application file for complete search history.

(56) References Cited

U.S. PATENT DOCUMENTS

| | | |
|---|---|---|
| 5,508,219 A | 4/1996 | Bronner et al. |
| 5,770,876 A | 6/1998 | Lam et al. |
| 6,261,908 B1 | 7/2001 | Hause et al. |
| 6,570,208 B2 | 5/2003 | Mandelman et al. |
| 6,815,749 B1 | 11/2004 | Mandelman et al. |
| 6,964,897 B2 | 11/2005 | Bard et al. |
| 6,974,991 B2 | 12/2005 | Cheng et al. |
| 7,157,329 B2 | 1/2007 | Tews et al. |
| 7,348,622 B2 * | 3/2008 | Chung et al. ................. 257/300 |
| 7,939,876 B2 * | 5/2011 | Cheng et al. ................. 257/301 |

* cited by examiner

*Primary Examiner* — William D Coleman
(74) *Attorney, Agent, or Firm* — Gibb & Riley, LLC; Anthony J. Canale

(57) ABSTRACT

A structure and method of making a field effect transistor (FET) embedded dynamic random access memory (eDRAM) cell array, which includes: a buried silicon strap extending into a buried oxide (BOX) layer of a silicon-on-insulator (SOI) substrate; a recessed trench capacitor extending down into the substrate layer of the SOI substrate; a lateral surface of a conductive top plate formed on the recessed trench capacitor that contacts a first lateral surface of the buried silicon strap; a dielectric cap disposed above the conductive top plate; a first FET formed from the silicon layer of the SOI substrate, in which a source/drain region of the first FET contacts a second lateral surface of the buried silicon strap; and a passing wordline disposed on a portion of the dielectric cap opposite to and separate from the buried silicon strap and connected to a gate of a second FET in an adjacent row of the FET eDRAM cell array.

20 Claims, 6 Drawing Sheets

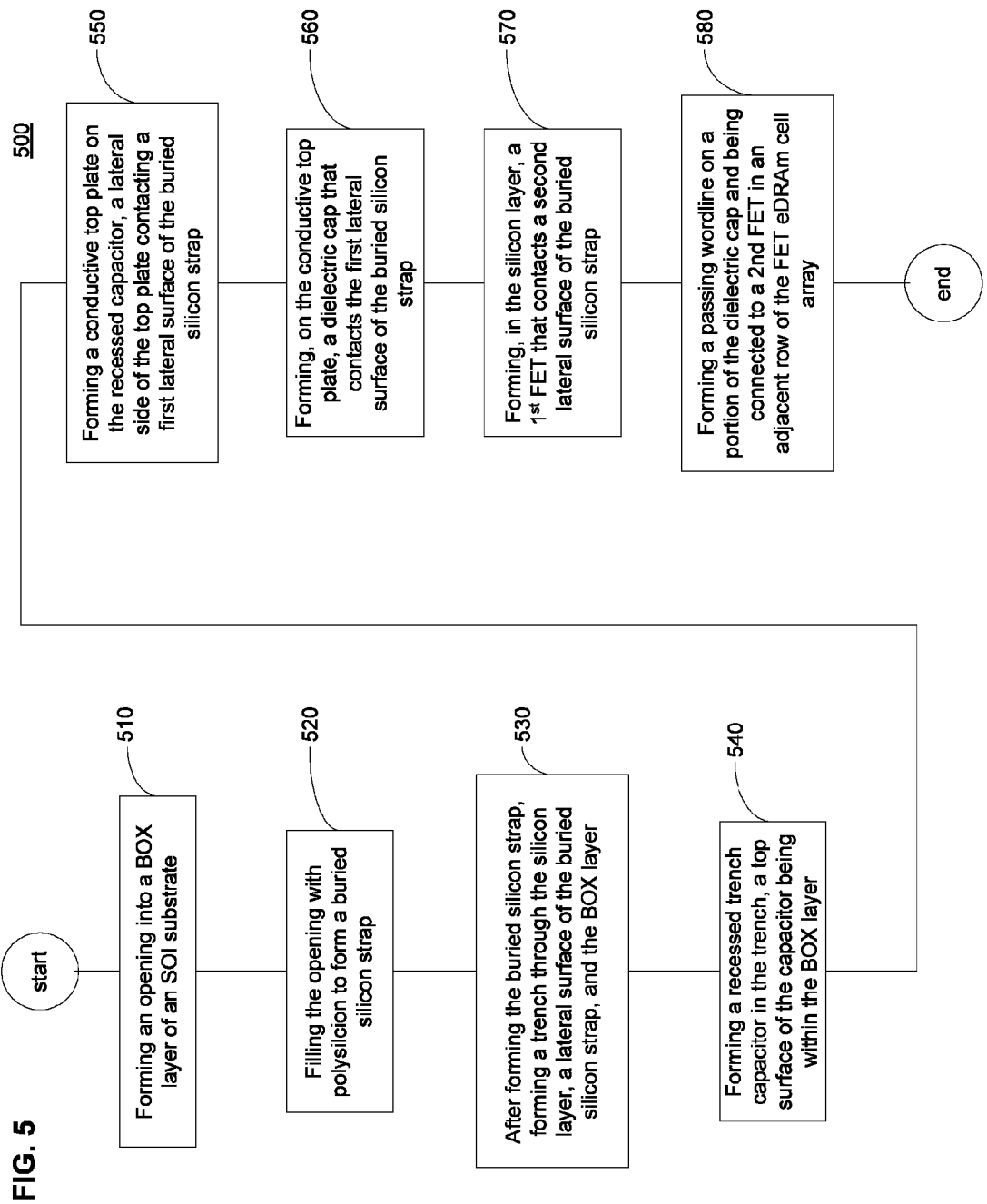

FET EDRAM TRENCH SELF-ALIGNED TO BURIED STRAP

BACKGROUND

1. Field of the Invention

The embodiments herein relate to a structure and method of manufacturing an embedded dynamic random access memory (eDRAM) cell array, in which each cell includes a field effect transistor (FET) formed on a silicon-on-insulator (SOI) substrate and a recessed trench capacitor that is self-aligned to a buried silicon strap. In particular, a passing wordline may be formed over a portion of a dielectric cap that covers the recessed trench capacitor of each eDRAM cell, thereby reducing the size of the eDRAM cell array. More particularly, the buried silicon strap may provide good electrical contact between a source/drain (S/D) region of the FET and the recessed trench capacitor.

2. Description of Related Art

A dynamic random access memory (DRAM) cell is essentially a capacitor for storing charge and an access transistor for transferring charge to and from the capacitor. One bit of data, determined by the presence or absence of charge on the capacitor, is stored in each DRAM cell.

A primary goal of designers is to increase chip density on a wafer of integrated circuit chips that include DRAM cell arrays. One way of increasing chip density is to reduce the size of DRAM cells within DRAM cell arrays by using trench capacitors, rather than planar capacitors. In a DRAM cell, a planar capacitor is used to store charge, in which the amount of charge stored is proportional to the area of the planar capacitor on the chip's surface. To increase chip density without sacrificing the amount of charge stored, deep trenches are etched in a silicon wafer to form trench capacitors, which are oriented vertically to with respect to the chip's surface. Thus, the surface area required for the capacitor is dramatically reduced without sacrificing capacitance and the amount of charge stored. The formation of multiple gate field effect transistors (MuGFETs) also allows for smaller DRAM cell sizes, while formation of planar FETs or MuGFETs on an SOI substrate improves transistor performance.

Referring to FIG. 1, a schematic diagram 100 illustrates a cross section of a portion of a row of a conventional eDRAM cell array that includes an eDRAM cell and a "passing wordline" 150 from an eDRAM cell in an adjacent row of the array. The eDRAM cell includes a trench capacitor 110 and, for example, a MuGFET access transistor 120, which is formed in the silicon layer 132 of an SOI substrate 130. Alternatively, a planar FET (not shown) may replace the MuGFET access transistor 120. A plate 112 of the trench capacitor 110 contacts a first source/drain (S/D) region 122 of the MuGFET 120 via a standard silicon strap 114, which covers the plate 112 of the trench capacitor 110. In the conventional method, the trench capacitor 110 must necessarily be formed before the overlying standard strap 114 is formed. The trench capacitor 110 extends from the plate 112 through the buried oxide (BOX) layer 134 and into the underlying substrate layer 136 of the SOI substrate 130 to a depth of several microns. A gate 128 of the MuGFET 120 covers a channel region and is disposed between a second S/D region 124 and the first S/D region 122. The "passing wordline" 150, from an eDRAM cell in an adjacent row of the eDRAM cell array, "passes" the eDRAM cell in a direction oriented perpendicularly to the page, and the trench capacitor 110 is separated from the passing wordline to prevent electrical coupling between the passing wordline 150 and the trench capacitor 110. The distance between the passing wordline 150 and the trench capacitor 110 adds to the area of the conventional eDRAM cell. A bit line contact 140 extends through an insulating layer 160 to contact the second S/D region of the MuGFET 120.

There remains a need for a structure and a method of manufacturing a smaller FET eDRAM array, including trench capacitors, to further increase chip density, improve performance, and reduce cost.

SUMMARY

An exemplary embodiment disclosed herein provides a structure and method of manufacturing an embedded dynamic random access memory (eDRAM) cell array, in which each cell includes a field effect transistor (FET) formed on a silicon-on-insulator (SOI) substrate and a recessed trench capacitor. The trench, in which the recessed trench capacitor is formed, is self-aligned to a previously formed buried silicon strap that provides electrical contact between a source/drain (S/D) region of the FET and the recessed trench capacitor. A passing wordline may be formed over a portion of a dielectric cap that covers the recessed trench capacitor of each eDRAM cell, thereby reducing the size of the eDRAM cell array in an exemplary embodiment herein.

In view of the foregoing, an exemplary embodiment disclosed herein provides a field effect transistor (FET) embedded dynamic random access memory (eDRAM) cell array, the device comprising: a silicon-on-insulator (SOI) substrate comprising a silicon layer formed on a buried oxide (BOX) layer, which is formed on a substrate layer; a buried silicon strap, including a first lateral surface and an opposite second lateral surface that extend through the silicon layer into the BOX layer, and a bottom surface disposed within the BOX layer; a recessed trench capacitor including a top surface disposed within the BOX layer and a lateral surface contacting the first lateral surface of the buried silicon strap; a conductive top plate formed on a top surface of the recessed trench capacitor, the conductive top plate including a top surface disposed within the BOX layer, and a lateral surface contacting the first lateral surface of the buried silicon strap; a dielectric cap formed on a top surface of the conductive top plate, the dielectric cap including a top surface that is coplanar with a top surface of the silicon layer; a first FET formed from the silicon layer, a first source/drain (S/D) region of the first FET contacting the opposite second lateral surface of the buried silicon strap; and a passing wordline disposed on a portion of the dielectric cap opposite to and separate from the buried silicon strap and being connected to a gate of a second FET in an adjacent row of the FET eDRAM cell array.

Another exemplary embodiment disclosed herein provides a method of manufacturing a field effect transistor (FET) embedded dynamic random access memory (eDRAM) cell array, the method comprising: masking and etching an opening through a silicon layer and into a buried oxide (BOX) layer of a silicon-on-insulator (SOI) substrate; filling the opening with polysilicon to form a buried silicon strap; after forming the buried silicon strap, masking and etching a trench through the silicon layer, a lateral surface of the buried silicon strap, and the BOX layer into a substrate layer of the SOI substrate, the trench being aligned with a first lateral surface of the buried silicon strap that is exposed by the etching of the trench; forming a thin dielectric on walls of the trench and filling the trench with a first conductor; recessing the first conductor to a level below that of a top surface of the BOX layer and removing the thin dielectric that is exposed by the recessing; forming a conductive top plate, comprising a second conductor, on a top surface of the recessed first conductor, a lateral surface of the conductive top plate contacting the first lateral surface of the buried silicon strap, and a top surface of the conductive top plate being disposed within the BOX layer; forming a dielectric cap on a top surface of the conductive top plate; forming a first FET from the silicon layer, a source/drain region of the first FET contacting an opposite second lateral surface of the buried silicon strap; and forming a passing wordline disposed over a portion of the dielectric cap opposite to and separate from the buried silicon strap, and being connected to a gate of a second FET in an adjacent row of an FET eDRAM cell array.

Yet another exemplary embodiment disclosed herein provides a method of manufacturing a field effect transistor (FET) embedded dynamic random access memory (eDRAM) cell array, the method comprising: forming an opening through a silicon layer and into a buried oxide (BOX) layer of a silicon-on-insulator (SOI) substrate; filling the first opening with polysilicon to form a buried silicon strap; after forming the buried silicon strap, forming a trench through the silicon layer, a lateral surface of the buried silicon strap, and the BOX layer into a substrate layer of the SOI substrate, the trench being aligned with a first lateral surface of the buried silicon strap that is exposed by the forming of the trench; forming a recessed trench capacitor in the trench, a top surface of the recessed trench capacitor being disposed within the BOX layer; forming a conductive top plate on a top surface of the recessed trench capacitor, a lateral side of the conductive top plate contacting the first lateral surface of the buried silicon strap; forming, on a top surface of the conductive top plate, a dielectric cap; forming, in the silicon layer, a first FET that contacts an opposite second lateral surface of the buried silicon strap; and forming a passing wordline disposed on a portion of the dielectric cap opposite to and separate from the buried silicon strap and being connected to a second FET in an adjacent row of an FET eDRAM cell array.

BRIEF DESCRIPTION OF THE DRAWINGS

The exemplary embodiments herein will be better understood from the following detailed description with reference to the drawings, which are not necessarily drawing to scale and in which:

FIG. 5 is a flowchart illustrating a method of manufacturing an FET eDRAM cell array in which, after the forming of the buried strap, a recessed trench capacitor is formed in a trench that is self-aligned to the buried strap in an exemplary embodiment herein.

DETAILED DESCRIPTION

Figure 1:
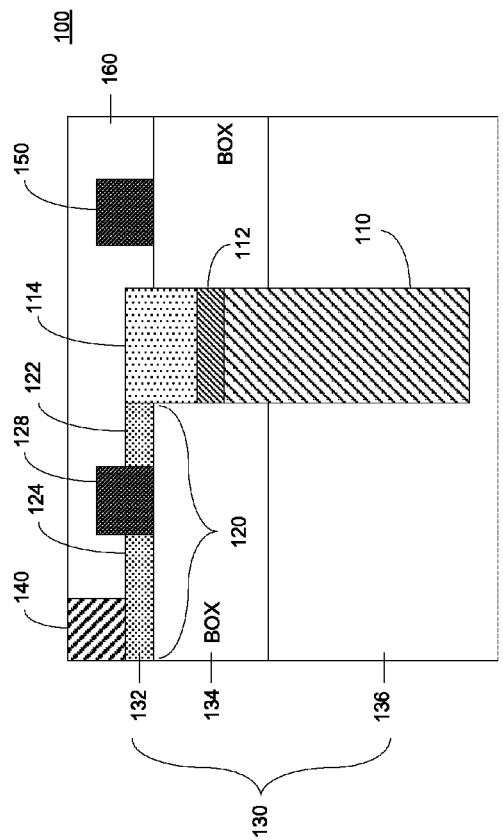
FIG. 1 is a schematic diagram illustrating a cross section of a portion of a row of a conventional embedded dynamic random access memory (eDRAM) cell array that comprises an eDRAM cell, which includes a multiple gate field effect transistor (MuGFET) 120 and a trench capacitor 110, and a "passing wordline" 150 from another eDRAM cell, which is separated from the eDRAM cell, in the related art.

The exemplary embodiments herein and the various features and advantageous details thereof are explained more fully with reference to the non-limiting exemplary embodiments that are illustrated in the accompanying drawings and detailed in the following description. It should be noted that the features illustrated in the drawings are not necessarily drawn to scale. Descriptions of well-known materials, components, and processing techniques are omitted so as to not unnecessarily obscure the exemplary embodiments herein. The examples used herein are intended to merely facilitate an understanding of ways in which the exemplary embodiments herein may be practiced and to further enable those of skill in the art to practice the exemplary embodiments herein. Accordingly, the examples should not be construed as limiting the scope of the exemplary embodiments herein.

As described above, there remains a need for a structure and a method of manufacturing a smaller field effect transistor (FET) embedded dynamic random access memory (eDRAM) array, including trench capacitors, to further increase chip density, improve performance, and reduce cost.

Figure 2A:
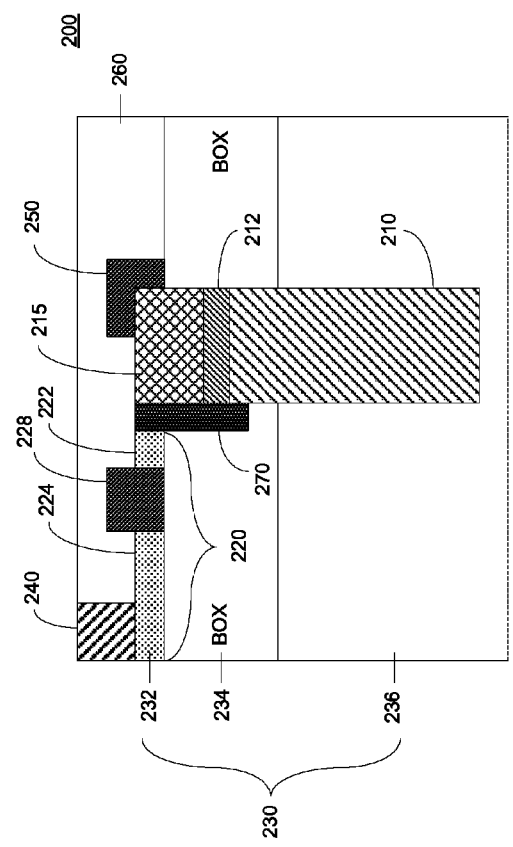
FIG. 2A is a schematic diagram illustrating a cross section of a portion of a row of an eDRAM cell array comprising: an eDRAM cell that includes an FET access transistor 220; a buried silicon strap 270; a recessed trench capacitor 210 that is formed within a trench, which is self-aligned to the buried silicon strap 270, and that is connected to the FET access transistor 220 via the buried silicon strap 270; a dielectric cap 215 that covers the recessed trench capacitor 210; a "passing wordline" 250 that is formed on a portion of the dielectric cap 215 opposite to and separate from the buried silicon strap 270 in an exemplary embodiment herein; and an insulator layer 260.

Referring to FIG. 2A, a schematic diagram 200 illustrates a cross section of a portion of a row of an eDRAM cell array, in an exemplary embodiment herein, that may comprise: an eDRAM cell that includes an FET access transistor 220, which may comprise one of a multiple gate FET (MuGFET) and a planar FET (not shown); a buried silicon strap 270; a recessed trench capacitor 210 that is self-aligned to the buried silicon strap 270 and that is connected to the FET access transistor 220 via the buried silicon strap 270; and a dielectric cap 215 that covers a conductive top plate 212 formed on the recessed trench capacitor 210. A "passing wordline" 250 from another eDRAM cell in an adjacent row of the eDRAM cell array may be formed on a portion of the dielectric cap 215. The FET 220 may be formed in a silicon layer 232 of an SOI substrate 230, and may include a first source/drain (S/D) region 222 separated from a second S/D region 224 by a gate region 228. In an exemplary embodiment herein, a length of the FET 220 may be shorter than that of the FET 120 shown in FIG. 1 of the related art. A bit line contact 240, comprising a conductor, may contact the second S/D region 224 of the FET 220.

In an exemplary embodiment herein, a recessed trench capacitor 210 may be formed within a trench that is self-aligned to the buried silicon strap 270, such that a top surface of the recessed trench capacitor 210 is at a level below that of a bottom surface of the silicon layer 232 of the FET 220. A lateral surface of the recessed trench capacitor 210 may contact a lowermost portion of the buried silicon strap 270. The recessed trench capacitor 210 may extend down from its top surface through the buried oxide (BOX) layer 234 and into the underlying substrate layer 236 of the SOI substrate 230 to a depth of several microns. The recessed trench capacitor 210 may include a thin dielectric (not shown) that forms all lateral surfaces and a bottom surface of the recessed trench capacitor 210, and that surrounds a center electrode of the recessed trench capacitor 210.

A conductive top plate 212 may be formed on an entire top surface of the recessed trench capacitor 210 and may be disposed within the BOX layer 234 in an exemplary embodiment herein. The conductive top plate 212 may include an entire lateral surface that contacts the buried silicon strap 270. The conductive top plate 212 may comprise a doped polysilicon. A dielectric cap 215 may be formed on an entire top surface of the conductive top plate 212 in an exemplary embodiment herein. The dielectric cap 215 may include a lateral surface that contacts an uppermost portion of the first lateral surface of the buried silicon strap. The dielectric cap 215 may extend up from the top surface of the conductive top plate 212 through an upper surface of the BOX layer 234 to a level co-planar with a top surface of the first S/D region 222 of the MuGFET 220.

In an exemplary embodiment herein, a buried silicon strap 270 may electrically contact a conductive top plate 212 of the recessed trench capacitor 210 with an edge of the first S/D region 222. The buried silicon strap 270 may comprise a first lateral surface and an opposite second lateral surface that extend down from its top surface to a bottom surface. The first lateral surface of the buried silicon strap 270 may contact a lateral surface of the recessed trench capacitor 210, an entire lateral surface of the conductive top plate 212, and a lateral surface of the dielectric cap 215. The opposite second lateral surface of the buried silicon strap 270 may contact the edge of the first S/D region 222 along its entire depth. The bottom surface of the buried silicon strap 270 may be disposed at a level beneath that of a bottom surface of the silicon layer 232 within the buried oxide (BOX) layer 234. The buried silicon strap 270 may extend up from its bottom surface through the top surface of the BOX layer 234 to a top surface at a height equal to that of the silicon layer 232 of the FET 220.

In an exemplary embodiment herein, a passing wordline 250, comprising a conductor, from an eDRAM cell in an adjacent row of the eDRAM cell array "passes", in a direction oriented perpendicularly to the page, the recessed trench capacitor 210, and is formed on a portion of the dielectric cap 215 that is opposite to and separate from the buried silicon strap 270, and on a portion of the top surface of the BOX layer 234 that is adjacent to the dielectric cap 215. The passing wordline 250, although partially disposed over the recessed trench capacitor 210, may be separated from the conductive top plate 212 of the recessed trench capacitor 210 by the thickness of the dielectric cap 215 between the top surface of the BOX 234 and the top surface of the conductive top plate 212 in an exemplary embodiment herein.

In an exemplary embodiment herein, the passing wordline 250 may be disposed more proximately to the recessed trench capacitor 210, when compared to the disposition of the passing word line 150 to the trench capacitor 110 of the related art as shown in FIG. 1. It is this greater proximity that allows adjacent FET eDRAM trenches within a row of an eDRAM array to be placed more closely together and to thereby reduce the size of the FET eDRAM array.

Figure 2B:
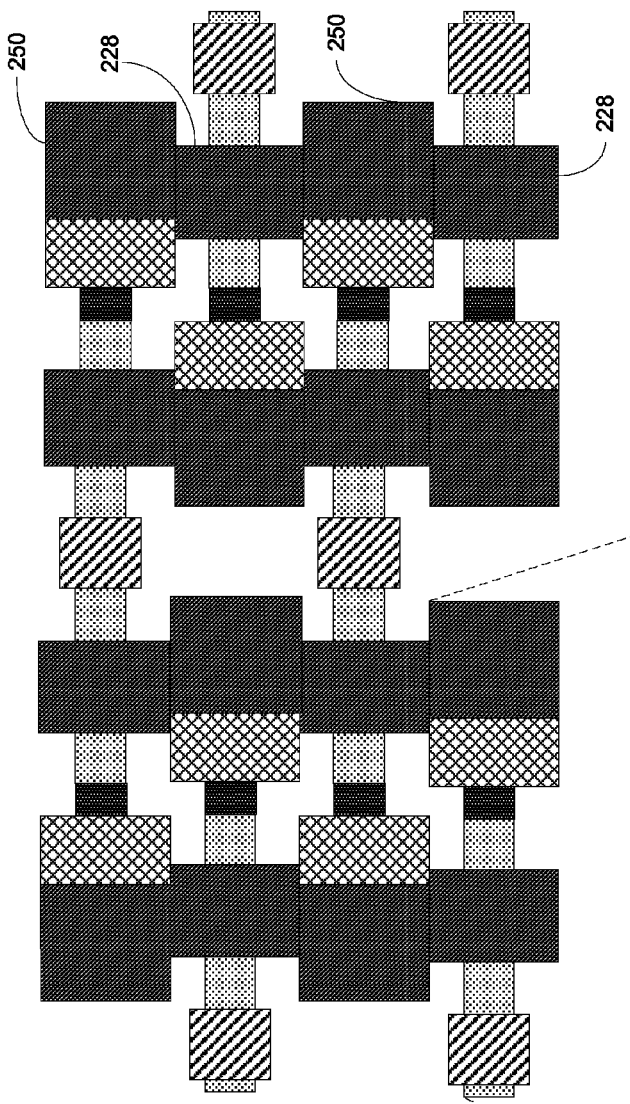
FIG. 2B is a schematic drawing illustrating a top view, without an overlying insulator, of, for example, a MuGFET eDRAM cell array showing a wordline of the array comprising alternating and connected passing wordlines 250 and MuGFET gates 228 in an exemplary embodiment herein.
Figure 2C:
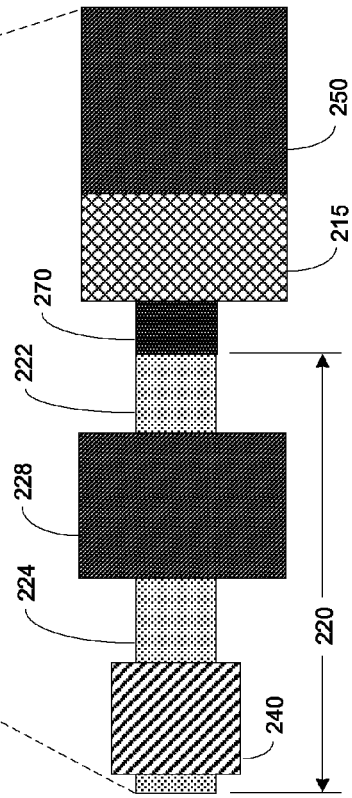
FIG. 2C is a schematic drawing illustrating an expanded top view, without an overlying insulator, of an eDRAM cell and a passing wordline 250 from the exemplary MuGFET eDRAM cell array of FIG. 2B in an exemplary embodiment herein.

Referring to FIGS. 2B and 2C, the schematic diagrams illustrate a top view of, for example, a MuGFET eDRAM cell array and a MuGFET eDRAM cell, respectively, with connecting wordlines between rows of the array, in which the overlying insulation layer is "removed" in an exemplary embodiment herein. Alternatively, a planar FET eDRAM cell array and a planar FET eDRAM cell, respectively, may be similarly envisioned with connecting wordlines between rows of the array, in which the overlying insulation layer is "removed" in another exemplary embodiment herein. The MuGFET eDRAM cell array of FIG. 2B comprises four rows, each row comprising two MuGFET eDRAM cells. As is known in the art, adjacent rows of an eDRAM cell array may be staggered and individual eDRAM cells may alternate their horizontal orientations within a single row. As may be shown in FIG. 2B, a gate 228 of a MuGFET eDRAM cell, or alternatively, a gate of a planar FET eDRAM cell (not shown), may be connected to the passing wordline 250 of an adjacent row in a staggered array. A wordline of a MuGFET eDRAM cell array may comprise a series of alternating gates 228 and passing wordlines 250 from adjacent rows of the MuGFET eDRAM cell array as illustrated in FIG. 2B. Similarly, a wordline of a planar FET eDRAM cell array may comprise a series of alternating gates and passing wordlines from adjacent rows of the planar FET eDRAM cell array (not shown).

As more clearly shown in FIG. 2C, a left lowermost MuGFET eDRAM cell may comprise a MuGFET 220, including a first S/D region 222, a gate 228, and a second S/D region 224, and a recessed trench capacitor (not shown) that is located beneath the dielectric cap 215 and a portion of the passing wordline 250, which overlies a portion of the dielectric cap 215. Similarly, a planar FET eDRAM cell may be envisioned that includes a first S/D region 222, a gate 228, and a second S/D region 224, and a recessed trench capacitor, which is located beneath the dielectric cap 215 and a portion of the passing wordline 250 in another exemplary embodiment herein. In an exemplary embodiment herein, the buried silicon strap 270 may be interposed between the first S/D region 222 and the dielectric cap 215, which overlies the recessed trench capacitor (not shown). A bit line contact 240 may overlie the second S/D region 224 of the MuGFET 220, or of a planar FET in an alternative exemplary embodiment herein.

Figure 3A:
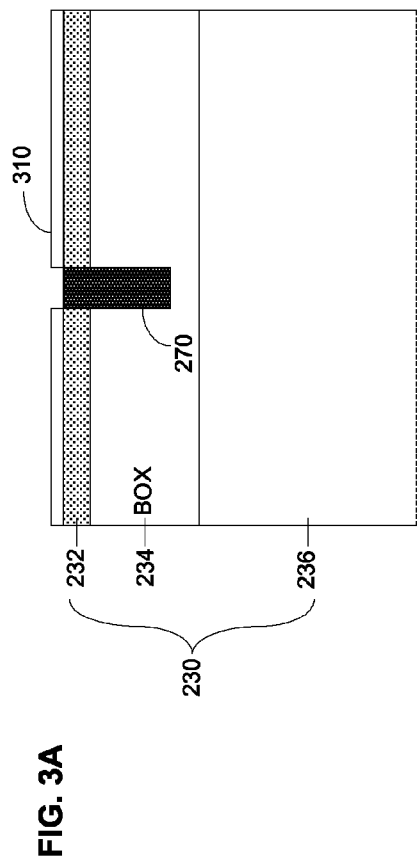
FIG. 3A is a schematic diagram illustrating a cross section of a portion of a row of an eDRAM cell array formed after initial processes of manufacturing, including formation of the buried silicon strap 270, in an exemplary embodiment herein.
Figure 3B:
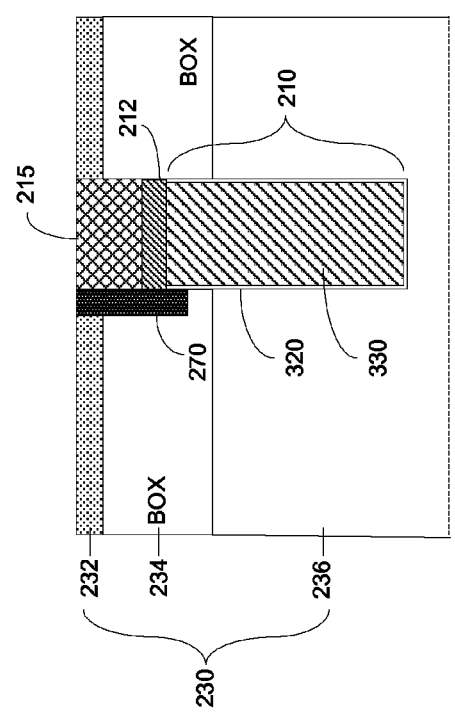
FIG. 3B is a schematic diagram illustrating a cross section of a portion of a row of an eDRAM cell array formed after intermediate processes of manufacturing, including formation of the recessed trench capacitor 210, which is self-aligned to the previously formed buried silicon strap 270, in an exemplary embodiment herein.
Figure 3C:
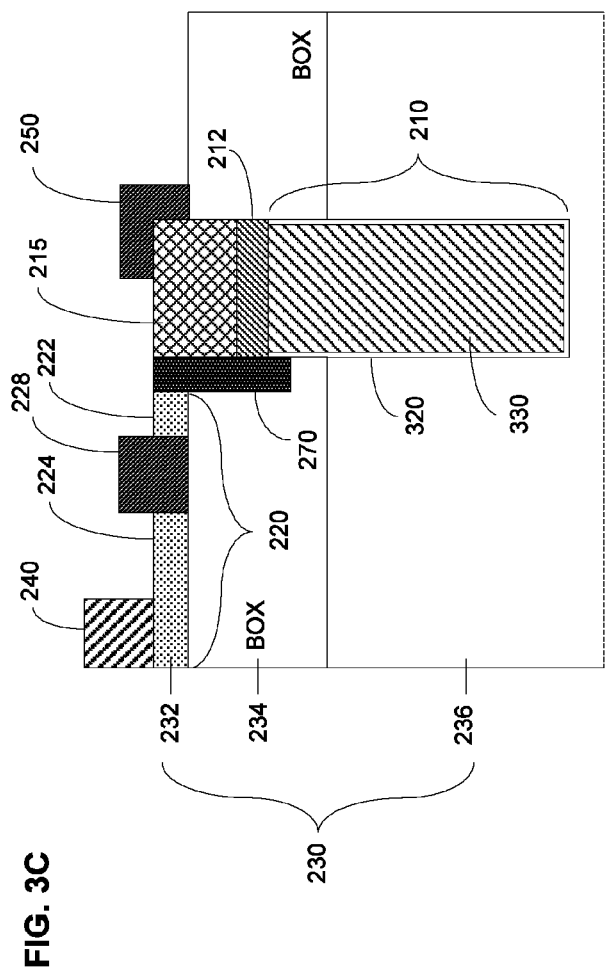
FIG. 3C is a schematic diagram illustrating a cross section of a portion of a row of an eDRAM cell array formed by final processes of manufacturing, including formation of a first FET 220, and a passing wordline 250 disposed over a portion of the dielectric cap 215 that is opposite to and separate from the buried silicon strap 270 and that covers the recessed trench capacitor 210, in an exemplary embodiment herein.

Processes for a method of manufacturing a portion of an FET eDRAM cell array with a recessed trench capacitor that is self-aligned to a buried silicon strap are successively illustrated by FIGS. 3A-C in an exemplary embodiment herein.

Referring to FIG. 3A, pad films 310, including, for example, any of an oxide layer and a nitride layer, may be formed on an SOI substrate 230 of the wafer. The wafer is masked, and the pad films 310, the silicon layer 232 and the BOX 234 layer of the underlying SOI substrate 230 may be etched to form an opening for the buried silicon strap 270. The opening for the buried silicon strap 270 may be wider than that of finally processed buried silicon strap 270 of an exemplary embodiment herein, because the initially formed buried silicon strap 270 may be subsequently etched on a lateral surface to form a portion of the trench for the recessed trench capacitor 210. The opening may be filled with a conductor, for example, doped polysilicon, to form the buried silicon strap 270 in an exemplary embodiment herein. As shown in FIG. 3A, the wafer may be polished and the upper surface of the buried silicon strap 270 recessed to a level equal to that of the upper surface of the silicon layer 232. The doped polysilicon of the buried silicon strap 270 may be annealed.

Referring to FIG. 3B, the wafer is masked, and a portion of the pad films 310, a portion of the silicon layer 232 adjacent the buried silicon strap 270, a lateral surface of the buried silicon strap 270, and portions of the BOX layer 234 and the substrate layer 236 of the SOI substrate 230 may be etched to form a trench of the eDRAM cell that is aligned with a first lateral surface of the buried silicon strap 270, which is exposed by the etching of the trench into the buried silicon strap 270, and that extends beyond a bottom surface of the buried silicon strap 270 to a depth of several microns within the substrate layer 236. When forming the recessed trench capacitor 210, a thin dielectric 320 may subsequently be formed on the walls and a bottom surface of the trench, and the trench may then be filled with a first conductor 330 to form a center electrode of the recessed trench capacitor 210. The thin dielectric 320 may comprise one or more layers of an oxide or a nitride. The first conductor 330 may comprise a doped polysilicon.

A recess may be formed in the first conductor 330 to a level below that of the top surface and above that of the bottom surface of the BOX layer 234, and the thin dielectric 320 that is exposed on the walls of the trench by recessing the first conductor 330 may be removed.

In an exemplary embodiment herein, a second conductor may fill the recess of the removed first conductor 330 and then be recessed to a level below that of the top surface of the BOX layer 234 to form a conductive top plate 212, in which the conductive top plate 212 is disposed beneath the top surface and above the bottom surface of the BOX layer 234. The second conductor of the conductive top plate 212 may comprise a doped polysilicon. An entire lateral surface of the conductive top plate 212 of the recessed trench capacitor 210 may contact the first lateral surface of the buried silicon strap 270, which was exposed by the etching the trench, in an exemplary embodiment herein. A dielectric may be deposited over an entire top surface of the conductive top plate 212 to form a dielectric cap 215, which overlies the recessed trench capacitor 210 in an exemplary embodiment herein. The dielectric may comprise various oxides or nitrides as are known in the art. As shown in FIG. 3B, the wafer may be polished and the remaining pad films 310 removed by chemical etching; thus, forming a top surface of the dielectric cap 215 that is equal in height to that of the top surface of the silicon layer 232 in an exemplary embodiment herein.

Referring to FIG. 3C, the wafer may be masked and the silicon layer 232 of the FET 220 may be formed in an exemplary embodiment herein. For example, a gate 228 may be formed over a channel region of a MuGFET or of a planar FET (not shown), and first and second S/D regions 222 and 224, respectively, may be formed on either sides of the gate 228. A passing wordline 250, comprising a conductor, from a gate of a corresponding MuGFET or planar FET eDRAM cell in an adjacent row of the FET eDRAM cell array may "pass", in a direction oriented perpendicularly to the page, the recessed trench capacitor 210, and may be formed on a portion of the dielectric cap 215 that is opposite to and separate from the buried silicon strap 270, and on a portion of the top surface of the BOX layer 234 that is adjacent the dielectric cap 215 in an exemplary embodiment herein. The passing wordline 250, although partially disposed over the recessed trench capacitor 210, may be separated from the conductive top plate 212 of the recessed trench capacitor 210 by the thickness of the dielectric cap 215 between the top surface of the BOX 234 and the top surface of the conductive top plate 212 in an exemplary embodiment herein. A bit line contact 240, comprising a conductor, may be formed from to the top surface of the second S/D region 224 of the FET 220.

Figure 4:
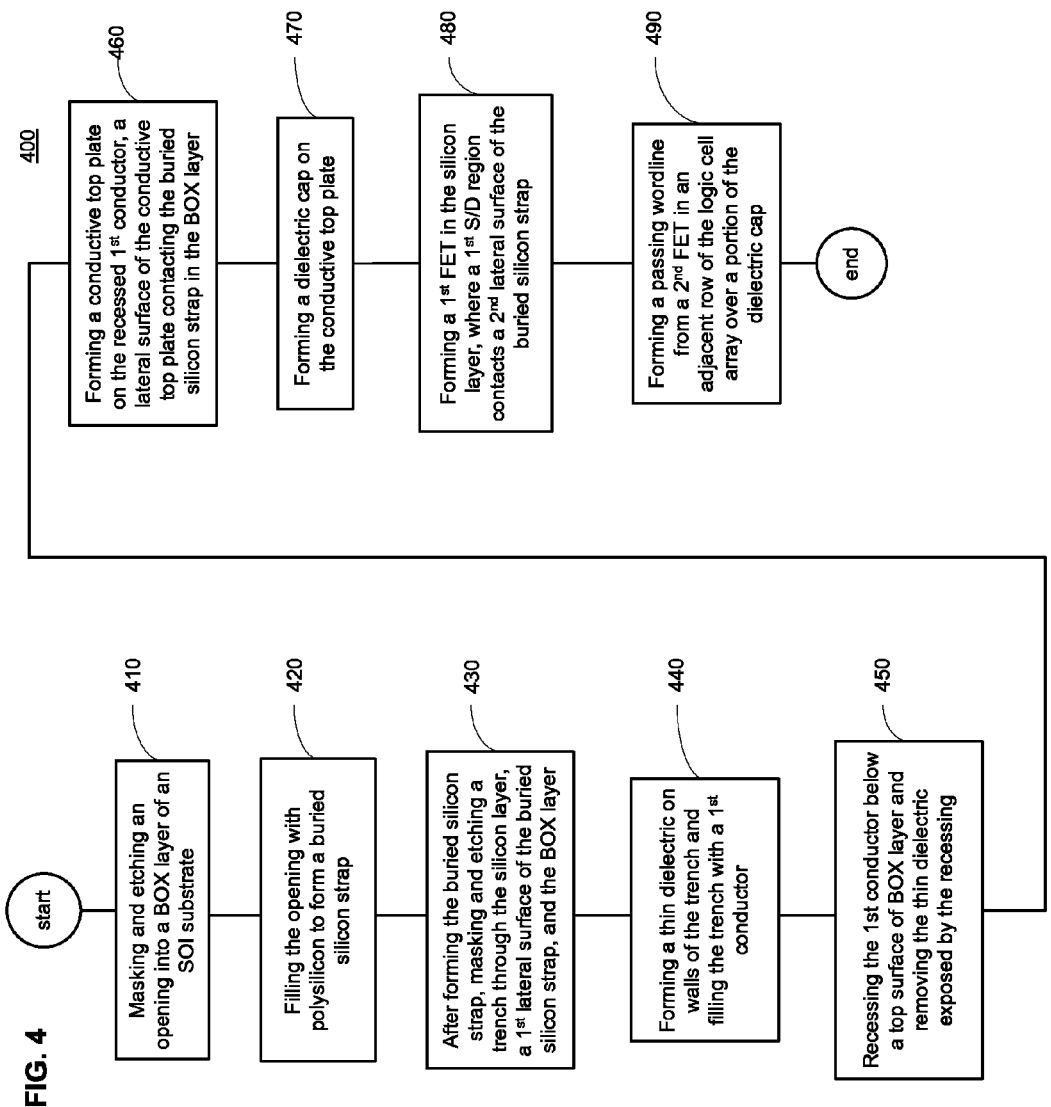
FIG. 4 is a flowchart illustrating a method of manufacturing an FET eDRAM cell array in which forming a recessed trench capacitor, after the forming of the buried strap, includes forming a thin dielectric on walls of a trench 440, which is self-aligned to the buried strap, in an exemplary embodiment herein.

Referring to FIG. 4, a flow chart 400 may illustrate an exemplary embodiment herein for a method of manufacturing an FET eDRAM cell array, the method comprising: masking and etching a first opening through a silicon layer and into a buried oxide (BOX) layer of a silicon-on-insulator (SOI) substrate 410; filling the first opening with polysilicon to form a buried silicon strap 420; masking and etching a trench through the silicon layer, a lateral surface of the buried silicon strap, and the BOX layer into a substrate layer of the SOT substrate, the trench being self-aligned with a first lateral surface of the buried silicon strap 430 that is exposed by etching of the trench; after etching the trench, forming a thin dielectric on walls of the trench and filling the trench with a first conductor 440; recessing the first conductor to a level below that of an upper surface of the BOX layer and removing the thin dielectric on the walls of the trench that are exposed by the recessing of the first conductor 450; forming a conductive top plate on the recessed first conductor, in which an entire lateral side of the conductive top plate contacts the first lateral surface of the buried silicon strap, wherein a top surface of the conductive top plate is disposed within the BOX layer 460; forming a dielectric cap on an entire top surface of the conductive top plate 470; forming a first FET from the silicon layer of the SOI substrate, a source/drain region of the first FET contacting an opposite second lateral surface of the buried silicon strap 480; and forming a passing wordline disposed over a portion of the dielectric cap opposite the buried silicon strap and on a portion of the top surface of the BOX layer 234 adjacent to the dielectric cap 215, and being connected to a gate of a second FET in an adjacent row of the FET eDRAM cell array 490.

Referring to FIG. 5, a flow chart 500 may illustrate another exemplary embodiment herein for the method of manufacturing an FET eDRAM cell array, the method comprising: forming a first opening through a silicon layer and into a buried oxide (BOX) layer of a silicon-on-insulator (SOI) substrate 510; filling the first opening with polysilicon to form a buried silicon strap 520; forming a trench through the silicon layer, a lateral surface of the buried silicon strap, and the BOX layer into a substrate layer of the SOI substrate, the trench being aligned with a first lateral surface of the buried silicon strap, which was exposed by the forming of the trench 530; forming a recessed trench capacitor in the trench, a top surface of the recessed trench capacitor being disposed within the BOX layer 540; forming a conductive top plate on the recessed trench capacitor, such that an entire lateral surface of the conductive top plate contacts the first lateral surface of the buried silicon strap 550; forming, on an entire top surface of the conductive top plate, a dielectric cap 560; forming, in the silicon layer, a first FET that contacts an opposite second lateral surface of the buried silicon strap 570; and forming a passing wordline disposed on a portion of the dielectric cap opposite the buried silicon strap and on a portion of the top surface of the BOX layer adjacent to the dielectric cap, and being connected to a second FET in an adjacent row of the FET eDRAM cell array 580.

The resulting integrated circuit chips, including an FET eDRAM cell array of an exemplary embodiment herein, may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other higher level carrier) or in a multichip package (such as a ceramic carrier that has either or both surface interconnections or buried interconnections). In any case the chip may then be integrated with other chips, discrete circuit elements, and/or other signal processing devices as part of either (a) an intermediate product, such as a motherboard, or (b) an end product. The end product may be any product that includes integrated circuit chips, ranging from toys and other low-end applications to advanced computer products having a display, a keyboard or other input device, and a central processor.

It should be understood that the terminology used herein is for the purpose of describing particular embodiments herein only and is not intended to be limiting. As used herein, the singular forms "a", "an" and "the" are intended to include the plural forms as well, unless the context clearly indicates otherwise. Additionally, terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It should further be understood that corresponding structures, materials, acts, and equivalents of all means or step plus function elements in the claims below are intended to include any structure, material, or act for performing the function in combination with other claimed elements as specifically claimed. The description of the embodiments herein has been presented for purposes of illustration and description, but is not intended to be exhaustive or limited to the embodiments herein in the form disclosed. Many modifications and variations will be apparent to those of ordinary skill in the art without departing from the scope and spirit of the embodiments herein. The embodiments herein as set forth above were chosen and described in order to best explain the principles of the embodiments herein and the practical application, and to enable others of ordinary skill in the art to understand the embodiments herein for various embodiments with various modifications as are suited to the particular use contemplated.

What is claimed is:

1. A device comprising:
    a silicon-on-insulator (SOI) substrate comprising a silicon layer formed on a buried oxide (BOX) layer, which is formed on a substrate layer;
    a buried silicon strap including a first lateral surface and an opposite second lateral surface that extend through said silicon layer into said BOX layer, and a bottom surface disposed within said BOX layer;
    a recessed trench capacitor including a top surface disposed within said BOX layer and a lateral surface contacting said first lateral surface of said buried silicon strap;
    a conductive top plate formed on said top surface of said recessed trench capacitor, said conductive top plate including a top surface disposed within said BOX layer, and a lateral surface contacting said first lateral surface of said buried silicon strap;
    a dielectric cap formed on a top surface of said conductive top plate, said dielectric cap including a top surface that is co-planar with a top surface of said silicon layer;
    a first FET formed from said silicon layer, a first source/drain (S/D) region of said first FET contacting said opposite second lateral surface of said buried silicon strap; and
    a passing wordline disposed on a portion of said dielectric cap opposite to and separate from said buried silicon strap and being connected to a gate of a second FET in an adjacent row of an FET eDRAM cell array.

2. The device of claim 1, wherein said first and second FETs may comprise one of: first and second planar FETs, respectively, and first and second multiple gate FETs (MuG-FETs), respectively.

3. The device of claim 1, wherein said recessed trench capacitor further comprises a thin dielectric that forms all lateral surfaces and a bottom surface of said recessed trench capacitor, and that surrounds a center electrode of said recessed trench capacitor.

4. The device of claim 1, wherein a bottom surface of said buried silicon strap extends down to at least a bottom surface of said conductive top plate within said BOX layer.

5. The device of claim 1, wherein another portion of said dielectric cap is formed on a portion of a top surface of said BOX layer.

6. The device of claim 2, wherein said passing wordline is disposed on a portion of said dielectric cap that is opposite to and separate from said buried silicon strap and said first FET.

7. The device of claim 6 further comprising a bit line contact that contacts said second S/D region of said first FET.

8. A method comprising:
    masking and etching an opening through a silicon layer and into a buried oxide (BOX) layer of a silicon-on-insulator (SOI) substrate;
    filling said opening with polysilicon to form a buried silicon strap;
    after forming said buried silicon strap, masking and etching a trench through said silicon layer, a lateral surface of said buried silicon strap, and said BOX layer into a substrate layer of said SOI substrate, said trench being aligned with a first lateral surface of said buried silicon strap that is exposed by said etching of said trench;
    forming a thin dielectric on walls of said trench and filling said trench with a first conductor;
    recessing said first conductor to a level below that of a top surface of said BOX layer and removing said thin dielectric that is exposed by said recessing;
    forming a conductive top plate, comprising a second conductor, on a top surface of the said recessed first conductor, a lateral surface of said conductive top plate contacting said first lateral surface of said buried silicon strap, and a top surface of said conductive top plate being disposed within said BOX layer;
    forming a dielectric cap on a top surface of said conductive top plate;
    forming a first FET from said silicon layer, a source/drain region of said first FET contacting an opposite second lateral surface of said buried silicon strap; and
    forming a passing wordline disposed over a portion of said dielectric cap opposite to and separate from said buried silicon strap, and being connected to a gate of a second FET in an adjacent row of an FET eDRAM cell array.

9. The method of claim 8 further comprising initially forming pad films, comprising any of an oxide layer and a nitride layer, on the SOI substrate, and etching said opening for said buried silicon strap and said trench for said recessed trench capacitor through said pad films.

10. The method of claim 8, wherein said first and second FETs may comprise one of: first and second planar FETs, respectively, and first and second multiple gate FETs (MuG-FETs), respectively, and wherein said first S/D region of said first FET contacts said opposite second lateral surface of said buried silicon strap.

11. The method of claim 8, wherein said first conductor forms a center electrode of a recessed trench capacitor.

12. The method of claim 8, wherein another portion of said dielectric cap is formed on a portion of a top surface of said BOX layer.

13. The method of claim 8, wherein a bottom surface of said buried silicon strap extends down to at least a bottom surface of said conductive top plate within said BOX layer.

14. The method of claim 8, wherein said conductive top plate and said thin dielectric are formed within said trench.

15. The method of claim 9 further comprising polishing said SOI substrate, such that a top surface of said dielectric cap is co-planar with a top surface of said silicon layer and removing said pad films.

16. The method of claim 10 further comprising forming a bit line contact that contacts said second S/D region of said first FET.

17. A method comprising:
- forming an opening through a silicon layer and into a buried oxide (BOX) layer of a silicon-on-insulator (SOI) substrate;
- filling said opening with polysilicon to form a buried silicon strap;
- after forming said buried silicon strap, forming a trench through said silicon layer, a lateral surface of said buried silicon strap, and said BOX layer into a substrate layer of said SOI substrate, said trench being aligned with a first lateral surface of said buried silicon strap that is exposed by said forming of said trench;
- forming a recessed trench capacitor in said trench, a top surface of said recessed trench capacitor being disposed within said BOX layer;
- forming a conductive top plate on a top surface of said recessed trench capacitor, a lateral side of said conductive top plate contacting said first lateral surface of said buried silicon strap;
- forming, on a top surface of said conductive top plate, a dielectric cap;
- forming, in said silicon layer, a first FET that contacts an opposite second lateral surface of said buried silicon strap; and
- forming a passing wordline disposed on a portion of said dielectric cap opposite to and separate from said buried silicon strap and being connected to a second FET in an adjacent row of an FET eDRAM cell array.

18. The method of claim 17, wherein said first and second FETs may comprise one of: first and second planar FETs, respectively, and first and second multiple gate FETs (MuG-FETs), respectively.

19. The method of claim 18, wherein said top surface of said conductive top plate is disposed within said BOX layer.

20. The method of claim 19, wherein a top surface of said dielectric cap is co-planar with a top surface of said silicon layer.

* * * * *